United States Patent
Ha et al.

(10) Patent No.: US 9,853,178 B2
(45) Date of Patent: Dec. 26, 2017

(54) SELECTIVE EMITTER SOLAR CELL

(71) Applicant: LG ELECTRONICS INC., Seoul (KR)

(72) Inventors: Jungmin Ha, Seoul (KR); Junyong Ahn, Seoul (KR); Jinho Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 212 days.

(21) Appl. No.: 14/788,057

(22) Filed: Jun. 30, 2015

(65) Prior Publication Data
US 2015/0303348 A1 Oct. 22, 2015

Related U.S. Application Data

(63) Continuation of application No. 12/878,469, filed on Sep. 9, 2010, now abandoned.

(30) Foreign Application Priority Data

Apr. 2, 2010 (KR) .................. 10-2010-0030250

(51) Int. Cl.
| | | |
|---|---|---|
| H01L 31/18 | (2006.01) | |
| H01L 31/0224 | (2006.01) | |
| H01L 31/068 | (2012.01) | |

(52) U.S. Cl.
CPC .. *H01L 31/1804* (2013.01); *H01L 31/022425* (2013.01); *H01L 31/068* (2013.01); *Y02E 10/547* (2013.01); *Y02P 70/521* (2015.11)

(58) Field of Classification Search
CPC ........ H10L 31/00–31/078; Y02E 10/50–10/60
(Continued)

(56) References Cited

U.S. PATENT DOCUMENTS 5,928,438 A * 7/1999 Salami ............ H01L 31/022425
                                                 136/255
6,552,414 B1  4/2003 Horzel et al.
(Continued)

FOREIGN PATENT DOCUMENTS

CN  1241298 A   1/2000
EP  0851511 A1  7/1998
(Continued)

OTHER PUBLICATIONS

J. Szlufcik, H. E. Elgamel, M. Ghannam, J. Nijs, R. Mertens, Simple Integral Screenprinting Process for Selective Emitter Polycrystalline Silicon Solar Cells, 1991, Appl. Phys. Lett. 59, vol. 13, pp. 1583-1584.*

(Continued)

*Primary Examiner* — Bach T Dinh
(74) *Attorney, Agent, or Firm* — Birch, Stewart, Kolasch & Birch, LLP

(57) ABSTRACT

A manufacturing method of selective emitter solar cell can include, forming an emitter layer positioned on a light receiving surface of the substrate having a first conductive type, the emitter layer having a second conductive type opposite to the first conductive type, forming a first emitter portion having a first impurity concentration and a second emitter portion having a second impurity concentration higher than the first impurity concentration on the emitter layer using a etch stop mask or a mask pattern, and forming a plurality of first electrodes connected to the second emitter portion, wherein the second emitter portion includes a first region that contacts the first electrodes and overlaps the first electrodes and a second region that is positioned around the first region and does not overlap the first electrodes, and the line width of the second region is more than the line width (Continued)

of each first electrode and less than four times the line width of each first electrode.

22 Claims, 9 Drawing Sheets

(58) Field of Classification Search
USPC .................................................. 136/243–265
See application file for complete search history.

(56) References Cited

U.S. PATENT DOCUMENTS

| | | |
|---|---|---|
| 6,696,739 B2 | 2/2004 | Lee et al. |
| 2003/0134469 A1* | 7/2003 | Horzel .............. H01L 21/67109 438/249 |
| 2008/0121265 A1 | 5/2008 | Hishida et al. |

FOREIGN PATENT DOCUMENTS

| | | |
|---|---|---|
| KR | 1999-0063990 A | 7/1999 |
| KR | 10-2006-0066280 A | 6/2006 |
| WO | WO-97/13280 A1 | 4/1997 |

OTHER PUBLICATIONS

Eyckmans et al., "Development of an Emitter for Solar Cells with Low Cost Contacts", 9th. E.C. Photovoltaic Solar Energy Conference, Frieburg, Germany, Sep. 25-29, 1989, pp. 414-415.

Szlufcik et al., "Simple Integral Screenprinting Process for Selective Emitter Polycrystalline Silicon Solar Cells", Applied Physics Letters, AIP, American Institute of Physics, vol. 59, No. 13, Sep. 23, 1991, pp. 1583-1584.

* cited by examiner

SELECTIVE EMITTER SOLAR CELL

CROSS-REFERENCE TO RELATED APPLICATIONS

This application is a continuation of co-pending U.S. patent application Ser. No. 12/878,469 filed on Sep. 9, 2010, which under 35 U.S.C. §119(a) claims the priority benefit of Patent Application No. 10-2010-0030250 filed in Korea on Apr. 2, 2010, all of which are hereby expressly incorporated by reference into the present application.

BACKGROUND OF THE INVENTION

Technical Field

Embodiments of the invention relate to a solar cell, and more particularly to a selective emitter solar cell.

Background Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A solar cell generally includes a substrate and an emitter layer which are respectively formed of different conductive type semiconductors, for example, p-type and n-type semiconductors. In this instance, the emitter layer is positioned at a light receiving surface of the substrate, and a p-n junction is formed at an interface between the substrate and the emitter layer. A first electrode and a first current collector electrically connected to the emitter layer are positioned on the emitter layer, and a second electrode electrically connected to the substrate is positioned on a surface opposite the light receiving surface of the substrate.

When light is incident on the solar cell having the above-described structure, electrons inside the semiconductors become free electrons (hereinafter referred to as "electrons") by the photoelectric effect. Further, electrons and holes respectively move to the n-type semiconductor (e.g., the emitter layer) and the p-type semiconductor (e.g., the substrate) based on the principle of the p-n junction. The electrons moving to the emitter layer and the holes moving to the substrate are respectively collected by the first electrode and the first current collector connected to the emitter layer and the second electrodes connected to the substrate.

The efficiency of the solar cell having the above-described structure is affected by a concentration of impurities used to dope the emitter layer.

For example, when the emitter layer is doped with impurities of a low concentration (i.e., when the emitter layer is a lightly doped region), a recombination of electrons and holes is reduced. Hence, a short circuit current density and an open-circuit voltage may increase. However, a reduction in a fill factor is caused because of an increase in a contact resistance.

Further, when the emitter layer is doped with impurities of a high concentration (i.e., when the emitter layer is a heavily doped region), the contact resistance may decrease and the fill factor may increase. However, the short circuit current density and the open-circuit voltage decrease.

Accordingly, a solar cell, for example, a selective emitter solar cell capable of obtaining both advantages of the lightly doped region and advantages of the heavily doped region has been recently developed.

The selective emitter solar cell has the structure in which an emitter layer includes a first emitter portion (i.e., a lightly doped region) and a second emitter portion (i.e., a heavily doped region) and a first electrode and a first current collector are positioned on the second emitter portion. Because the entire area of the emitter layer has a uniform impurity concentration because of the structure of the selective emitter solar cell, the selective emitter solar cell has an efficiency higher than a conventional solar cell.

However, in the selective emitter solar cell, if the first electrode and the first current collector are not formed at a correct location of the second emitter portion, a parallel resistance increases and thus the fill factor decreases. Hence, the efficiency of the selective emitter solar cell cannot be efficiently improved.

SUMMARY OF THE INVENTION

In one aspect, there is a selective emitter solar cell including a substrate first conductive type, an emitter layer of a second conductive type positioned on a light receiving surface of the substrate, and a plurality of first electrodes that are positioned on the emitter layer and are electrically connected to the emitter layer, wherein the emitter layer includes a first emitter portion having a first impurity concentration and a second emitter portion having a second impurity concentration higher than the first impurity concentration, the second emitter portion includes a first region that directly contacts at least one of the plurality of first electrodes and overlaps the at least one of the plurality of first electrodes, and a second region that is positioned around the first region and does not overlap the at least one of the plurality of first electrodes, and a line width of the second region is equal to or less than about eight times a line width of each of the plurality of first electrodes.

The line width of each first electrode is substantially equal to a line width of the first region. A thickness of the second emitter portion is greater than a thickness of the first emitter portion. An upper surface or a lower surface of the first emitter portion and an upper surface or a lower surface of the second emitter portion are positioned on the same plane.

The second region is positioned at one side or both sides of the first region.

When the second region is positioned at the both sides of the first region, line widths of two portion of the second region may be equal to or different from each other.

The line width of the second region is equal to or greater than the line width of each first electrode. The line width of the second region is equal to or less than about four times the line width of each first electrode. The line width of each first electrode is approximately 40 μm to 100 μm.

The selective emitter solar cell further includes at least one first current collector that is positioned on the emitter layer in a direction crossing the plurality of first electrodes and is electrically connected to the emitter layer. The second emitter portion further includes a third region that directly contacts the at least one first current collector and overlaps the at least one first current collector, and a fourth region that is positioned around the third region and does not overlap the at least one first current collector.

A sum of a line width of the third region and a line width of the fourth region is 1.01 to 1.4 times a line width of the at least one first current collector. A line width of the at least one first current collector is substantially equal to a line width of the third region.

The fourth region is positioned at one side or both sides of the third region.

When the fourth region is positioned at the both sides of the third region, line widths of two portions of the fourth region may be equal to or different from each other.

A line width of the fourth region is 0.01 to 0.4 times the line width of the at least one first current collector.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1:
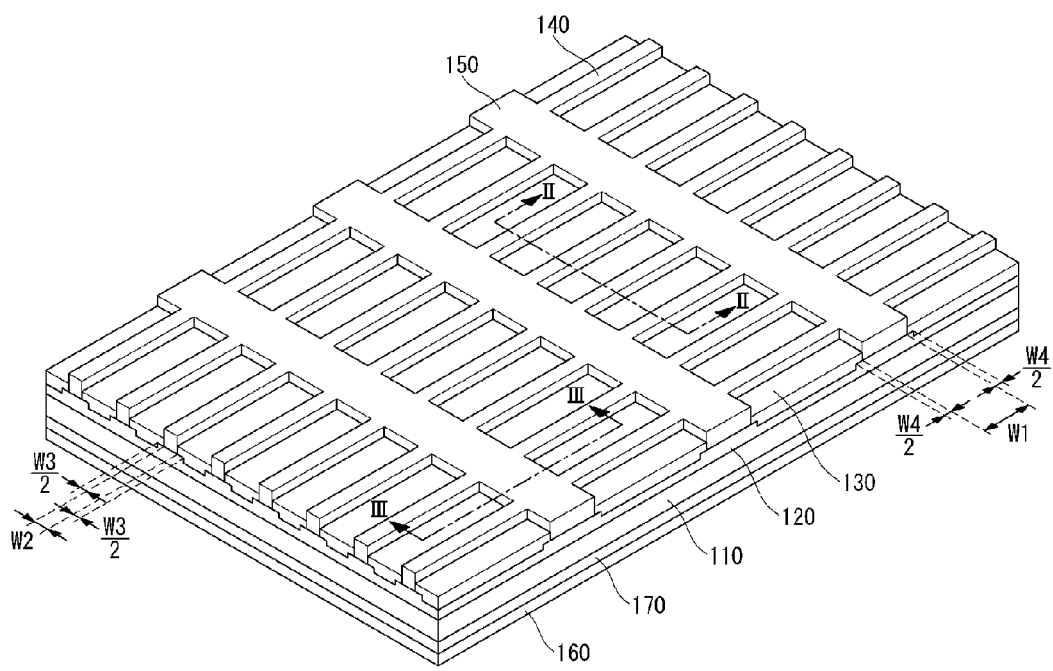
FIG. 1 is a partial perspective view of a selective emitter solar cell according to a first example embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
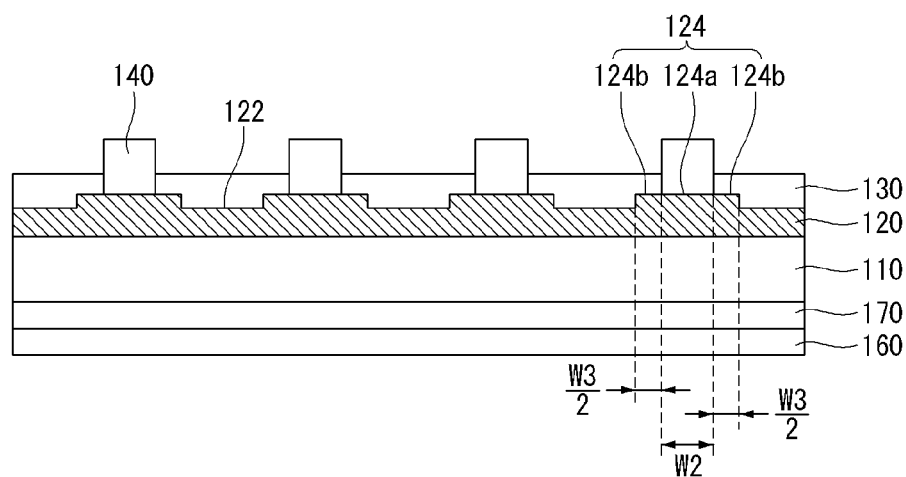
FIG. 2 is a partial cross-sectional view taken along line II-II of FIG. 1.

FIG. 1 is a partial perspective view of a solar cell according to a first example embodiment of the invention. FIG. 2 is a partial cross-sectional view taken along line II-II of FIG. 1, and FIG. 3 is a partial cross-sectional view taken along line III-III of FIG. 1.

Figure 3:
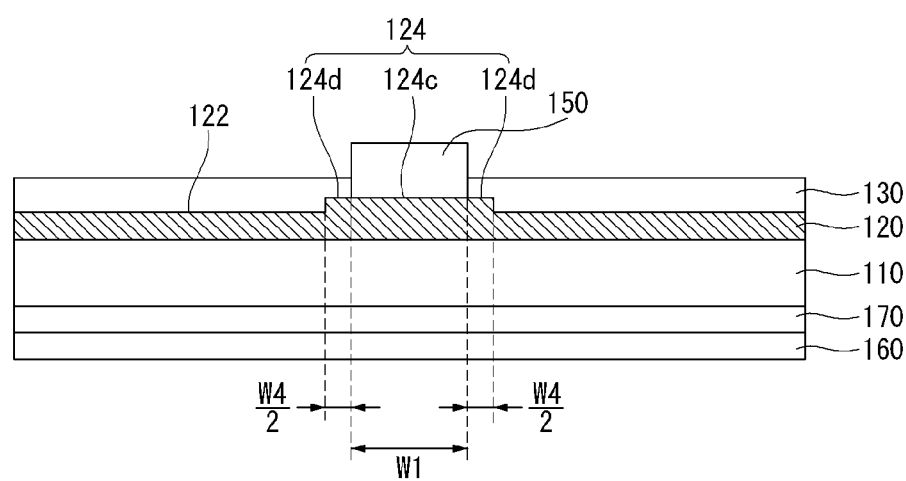
FIG. 3 is a partial cross-sectional view taken along line III-III of FIG. 1.

As shown in FIGS. 1 to 3, a selective emitter solar cell according to a first example embodiment of the invention includes a substrate 110, a selective emitter layer 120 positioned on one surface of the substrate 110, an anti-reflection layer 130 positioned on the selective emitter layer 120, a plurality of first electrodes 140 electrically connected to the selective emitter layer 120, at least one first current collector 150 electrically connected to the selective emitter layer 120, a second electrode 160 that is positioned on another surface of the substrate 110 and is electrically connected to the substrate 110, and a back surface field layer 170 positioned between the substrate 110 and the second electrode 160.

In the first example embodiment of the invention, the substrate 110 is a semiconductor substrate formed of first conductive type silicon, for example, p-type silicon, though not required. Examples of silicon include single crystal silicon, polycrystalline silicon, and amorphous silicon. When the substrate 110 is of a p-type, the substrate 110 contains impurities of a group III element such as boron (B), gallium (Ga), and indium (In). Alternatively, the substrate 110 may be of an n-type, and/or be formed of materials other than silicon. If the substrate 110 is of the n-type, the substrate 110 may contain impurities of a group V element such as phosphor (P), arsenic (As), and antimony (Sb).

The selective emitter layer 120 is a portion doped with impurities (for example, n-type impurities) of a second conductive type opposite a first conductive type (i.e., p-type impurities) of the substrate 110. The selective emitter layer 120 is formed at a light incident surface, i.e., a front surface corresponding to a light receiving surface of the substrate 110. The selective emitter layer 120 includes a first emitter portion 122 and a second emitter portion 124 each having a different impurity concentration.

In the first example embodiment of the invention, an impurity concentration of the second emitter portion 124 is higher than an impurity concentration of the first emitter portion 122. Further, an impurity doping thickness of the second emitter portion 124 is greater than an impurity doping thickness of the first emitter portion 122. Accordingly, a thickness of the second emitter portion 124 is greater than a thickness of the first emitter portion 122, and a lower surface of the first emitter portion 122 and a lower surface of the second emitter portion 124 are positioned on the same plane. The selective emitter layer 120 having the above-described structure may be formed using an etch back process.

As above, because the impurity doping thickness of the second emitter portion 124 is greater than the impurity doping thickness of the first emitter portion 122, a surface resistance of the second emitter portion 124 is less than a surface resistance of the first emitter portion 122.

The selective emitter layer 120 having the above-described structure and the substrate 110 form a p-n junction.

A plurality of electron-hole pairs produced by light incident on the substrate 110 are separated into electrons and holes by the p-n junction between the selective emitter layer 120 and the substrate 110. Then, the separated electrons move to an n-type semiconductor, and the separated holes move to a p-type semiconductor.

Thus, when the substrate 110 is the p-type semiconductor and the selective emitter layer 120 is the n-type semiconductor, the separated holes move to the substrate 110 and the separated electrons move to the selective emitter layer 120. On the contrary, when the substrate 110 is the n-type semiconductor and the selective emitter layer 120 is the p-type semiconductor, the separated electrons move to the substrate 110 and the separated holes move to the selective emitter layer 120.

When the selective emitter layer 120 is of the n-type, the selective emitter layer 120 may be formed by doping the substrate 110 with impurities of a group V element such as P, As, and Sb. On the contrary, when the selective emitter layer 120 is of the p-type, the selective emitter layer 120 may be formed by doping the substrate 110 with impurities of a group III element such as B, Ga, and In.

In the first example embodiment of the invention, the second emitter portion 124 of the selective emitter layer 120 includes a first region 124a, a second region 124b, a third region 124c, and a fourth region 124d. The first region 124a and the second region 124b are positioned under the first electrodes 140, and the third region 124c and the fourth region 124d are positioned under the first current collector 150.

The first region 124a directly contacts the first electrodes 140 and thus is an overlapping region between the first electrodes 140 and the second emitter portion 124. The third region 124c directly contacts the first current collector 150 and thus is an overlapping region between the first current collector 150 and the second emitter portion 124. The second region 124b is positioned around the first region 124a and does not overlap the first electrodes 140. The fourth region 124d is positioned around the third region 124c and does not overlap the first current collector 150. Accordingly, the first electrodes 140 are positioned on the first region 124a of the second emitter portion 124 and directly contact the first region 124a, and the first current collector 150 is positioned on the third region 124c of the second emitter portion 124 and directly contacts the third region 124c.

The first electrodes 140 and the at least one first current collector 150 may be formed at least one conductive metal material selected from the group consisting of nickel (Ni), copper (Cu), silver (Ag), aluminum (Al), tin (Sn), zinc (Zn), indium (In), titanium (Ti), gold (Au), and a combination thereof. Other materials may be used.

Each of the first electrodes 140 collects carriers (for example, electrons) moving to the selective emitter layer 120 and transfers the carriers to a desired location. The at least one first current collector 150 collects the carriers moving along the first electrodes 140 and outputs the carriers to the outside.

A line width W1 of the first current collector 150 is greater than a line width W2 of the first electrode 140, so that the collection efficiency of moving carriers (for example, electrons) is improved. In the first example embodiment of the invention, the line width W1 of the first current collector 150 is approximately 1,000 μm to 3,000 μm, preferably approximately 1,500 μm, and the line width W2 of the first electrode 140 is approximately 40 μm to 300 μm, preferably approximately 40 μm to 100 μm.

In the first example embodiment of the invention, a line width of the first region 124a is substantially equal to the line width W2 of the first electrode 140, and a line width W3 of the second region 124b is about one to eight times the line width W2 of the first electrode 140. The second region 124b may be equally dividedly positioned at both sides of the first region 124a, and thus both portions of the second region 124b have the same line width of W3/2. Alternatively, the both portions of the second region 124b that are dividedly positioned at both sides of the first region 124a may have different line widths. In embodiments of the invention, portions of the second region 124b hem in the first region 124a from opposite sides.

Figure 4:
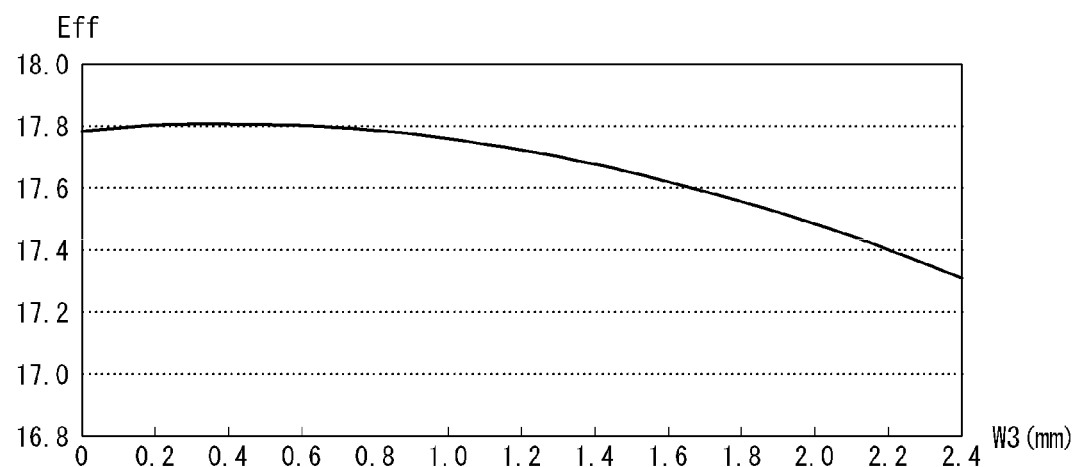
FIG. 4 is a graph illustrating a relationship between a line width of a second region and a conversion efficiency.

FIG. 4 is a graph illustrating a relationship between the line width W3 of the second region 124b and a conversion efficiency Eff of the selective emitter solar cell according to the first example embodiment of the invention. The graph illustrated in FIG. 4 is a simulation result measured when the line width W2 of the first electrode 140 is 100 μm.

As shown in FIG. 4, the conversion efficiency Eff scarcely changes and is maintained at a predetermined level, for example, 17.8% until the line width W3 of the second region 124b reaches about eight times the line width W2 of the first electrode 140. When the line width W3 of the second region 124b exceeds eight times the line width W2 of the first electrode 140, the conversion efficiency Eff is gradually reduced. Accordingly, it is preferable that the line width W3 of the second region 124b be equal to or less than about eight times the line width W2 of the first electrode 140.

Further, as shown in FIG. 4, when the line width W3 of the second region 124b is zero, the conversion efficiency Eff is maintained at the predetermined level. However, the fact that the line width W3 of the second region 124b is zero indicates the line width (i.e., W2+W3) of the second emitter portion 124 is equal to the line width W2 of the first electrode 140. In this instance, it is very difficult to mass-produce the selective emitter solar cell in which the first electrode 140 and the second emitter portion 124 are aligned at a correct location.

Accordingly, it is preferable that the line width W3 of the second region 124b is about one to eight times the line width W2 of the first electrode 140 so that the conversion efficiency Eff is maintained at the predetermined level while well maintaining the production of the selective emitter solar cell.

Figure 5:
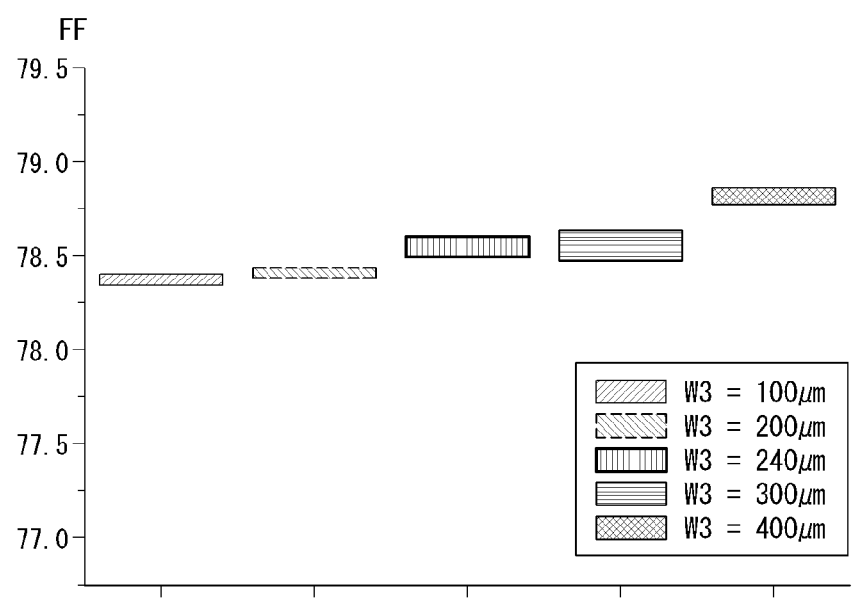
FIG. 5 is a graph illustrating a relationship between a line width of a second region and a fill factor.
Figure 6:
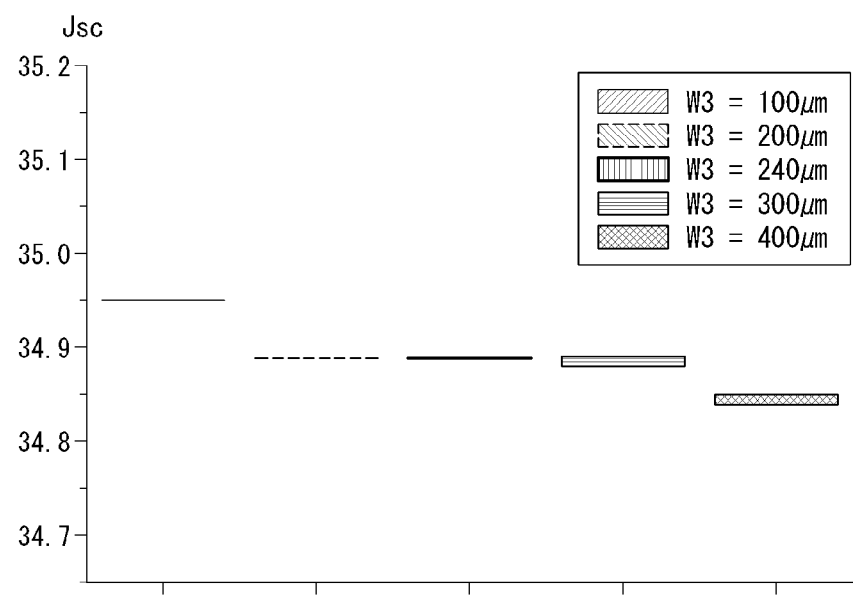
FIG. 6 is a graph illustrating a relationship between a line width of a second region and a short circuit current density.
Figure 7:
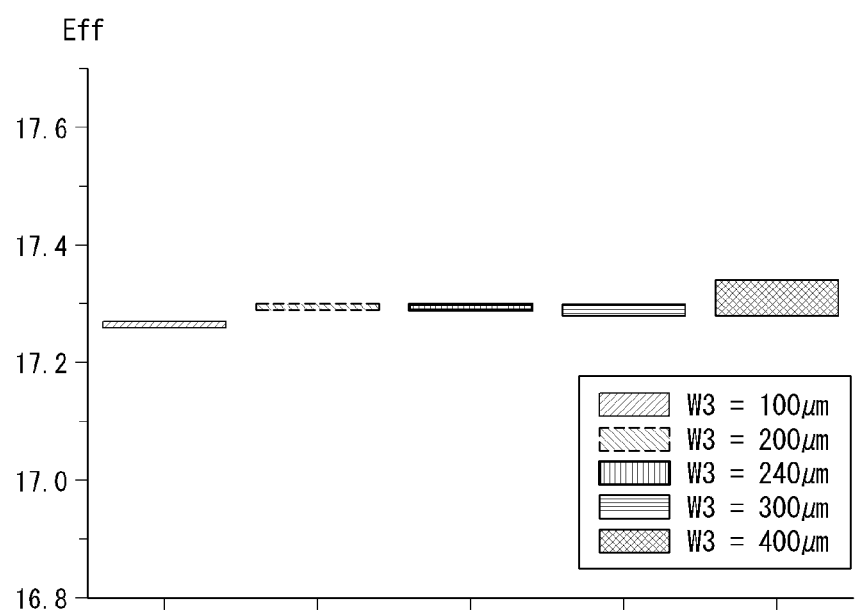
FIG. 7 is a graph illustrating a relationship between a line width of a second region and a conversion efficiency.

FIGS. 5 to 7 are graphs for describing more concretely the simulation result of FIG. 4. More specifically, FIG. 5 is a simulation result illustrating a relationship between the line width W3 of the second region 124b and a fill factor FF of the selective emitter solar cell, FIG. 6 is a simulation result illustrating a relationship between the line width W3 of the second region 124b and a short circuit current density JSC of the selective emitter solar cell, and FIG. 7 is a simulation result illustrating a relationship between the line width W3 of the second region 124b and a conversion efficiency Eff of the selective emitter solar cell.

As shown in FIGS. 5 to 7, when the line width W2 of the first electrode 140 is 100 μm and the line width W3 of the second region 124b is 100 μm to 400 μm, an effect of the fill factor FF and an effect of the short circuit current density JSC complement each other. Thus, the entire conversion efficiency Eff of the selective emitter solar cell is maintained at a uniform level.

Accordingly, when the line width W3 of the second region 124b is about one to four times the line width W2 of the first electrode 140, the short circuit current density JSC decreases because of a decrease in the size of the first emitter portion 122, but the fill factor FF increases. Hence, a misalignment between the second emitter portion 124 and the first electrodes 140 may be efficiently prevented or reduced without reducing the entire conversion efficiency Eff of the selective emitter solar cell.

As shown in FIG. 3, a line width of the third region 124c is substantially equal to the line width W1 of the first current collector 150. The fourth region 124d may be equally dividedly positioned at both sides of the third region 124c in the same manner as the second region 124b, and thus both portions of the fourth region 124d have the same line width of W4/2. Alternatively, the both portions of the fourth region 124d that are dividedly positioned at both sides of the third region 124c may have different line widths. In embodiments of the invention, portions of the fourth region 124d hem in the third region 124c from opposite sides.

The line width W4 of the fourth region 124d may be substantially equal to the line width W3 of the second region 124b. In this instance, when the line width W1 of the first current collector 150 is set to 1,000 μm and the line width W2 of the first electrode 140 is set to 40 μm to 100 μm, each of the line width W3 of the second region 124b and the line width W4 of the fourth region 124d is 40 μm to 400 μm. In this instance, because a sum (W1+W4) of the line width W1 of the third region 124c and the line width W4 of the fourth region 124d is 1,040 μm to 1,400 μm, the sum (W1+W4) is 1.04 to 1.4 times the line width W1 of the first current collector 150, and the line width W4 of the fourth region 124d is 0.04 to 0.4 times the line width W1 of the first current collector 150.

Further, when the line width W1 of the first current collector 150 is set to 3,000 μm and the line width W2 of the first electrode 140 is set to 40 μm to 100 μm, each of the line width W3 of the second region 124b and the line width W4 of the fourth region 124d is 40 μm to 400 μm. In this instance, because a sum (W1+W4) of the line width W1 of the third region 124c and the line width W4 of the fourth region 124d is 3,040 μm to 3,400 μm, the sum (W1+W4) is 1.01 to 1.13 times the line width W1 of the first current collector 150, and the line width W4 of the fourth region 124d is 0.01 to 0.13 times the line width W1 of the first current collector 150.

Accordingly, the sum (W1+W4) of the line width W1 of the third region 124c and the line width W4 of the fourth region 124d is 1.01 to 1.4 times the line width W1 of the first current collector 150, and the line width W4 of the fourth region 124d is 0.01 to 0.4 times the line width W1 of the first current collector 150. Because the second emitter portion 124 having the above-described structure directly contacts the first electrodes 140 and the first current collector 150 positioned on the second emitter portion 124, the second emitter portion 124 may serve as an ohmic contact member capable of reducing a contact resistance between the selective emitter layer 120 and the first electrodes 140 and the first current collector 150.

The anti-reflection layer 130 is positioned on the selective emitter layer 120, on which the first electrodes 140 and the first current collector 150 are not positioned, and is formed of silicon nitride (SiNx) and/or silicon dioxide ($SiO_2$). The anti-reflection layer 130 reduces a reflectance of light incident on the selective emitter solar cell and increases a selectivity of a predetermined wavelength band, thereby increasing the efficiency of the selective emitter solar cell. The anti-reflection layer 130 may have a thickness of about 70 nm to 80 nm. The anti-reflection layer 130 may be omitted, if desired.

The second electrode 160 is entirely positioned on a back surface opposite the front surface of the substrate 110 and is electrically connected to the substrate 110. The second electrode 160 collects carriers (for example, holes) moving to the substrate 110. The second electrode 160 may be formed at least one conductive metal material selected from the group consisting of nickel (Ni), copper (Cu), silver (Ag), aluminum (Al), tin (Sn), zinc (Zn), indium (In), titanium (Ti), gold (Au), and a combination thereof. Other materials may be used.

The back surface field layer 170 between the second electrode 160 and the substrate 110 is a region (e.g., a p+-type region) that is more heavily doped with impurities of the same conductive type as the substrate 110 than the substrate 110. The movement of carriers (for example, electrons) to the back surface of the substrate 110 is prevented or reduced by a potential barrier resulting from a difference between impurity doping concentrations of the substrate 110 and the back surface field layer 170. Thus, a recombination and/or a disappearance of electrons and holes around the back surface of the substrate 110 are prevented or reduced.

An operation of the selective emitter solar cell having the above-described structure is described below. When light irradiated to the selective emitter solar cell is incident on the substrate 110 through the anti-reflection layer 130 and the selective emitter layer 120, a plurality of electron-hole pairs are generated in the substrate 110 by light energy based on the incident light. Further, because a reflection loss of light incident on the substrate 110 is reduced by the anti-reflection layer 130, an amount of light incident on the substrate 110 increases.

The electron-hole pairs are separated into electrons and holes by the photoelectric effect, and the separated electrons move to the n-type selective emitter layer 120 and the separated holes move to the p-type substrate 110. The electrons moving to the n-type selective emitter layer 120 are collected by the first electrodes 140 contacting the second emitter portion 124, are transferred along the first electrodes 140, and are collected by the first current collector 150. The holes moving to the p-type substrate 110 are collected by the second electrode 160 and then are collected by a second current collector.

A method for forming the selective emitter layer 120 of the selective emitter solar cell according to the first example embodiment of the invention is described below with reference to FIG. 8.

As discussed above, the selective emitter layer 120 is formed using the etch back process in the first example embodiment of the invention.

Figure 8:
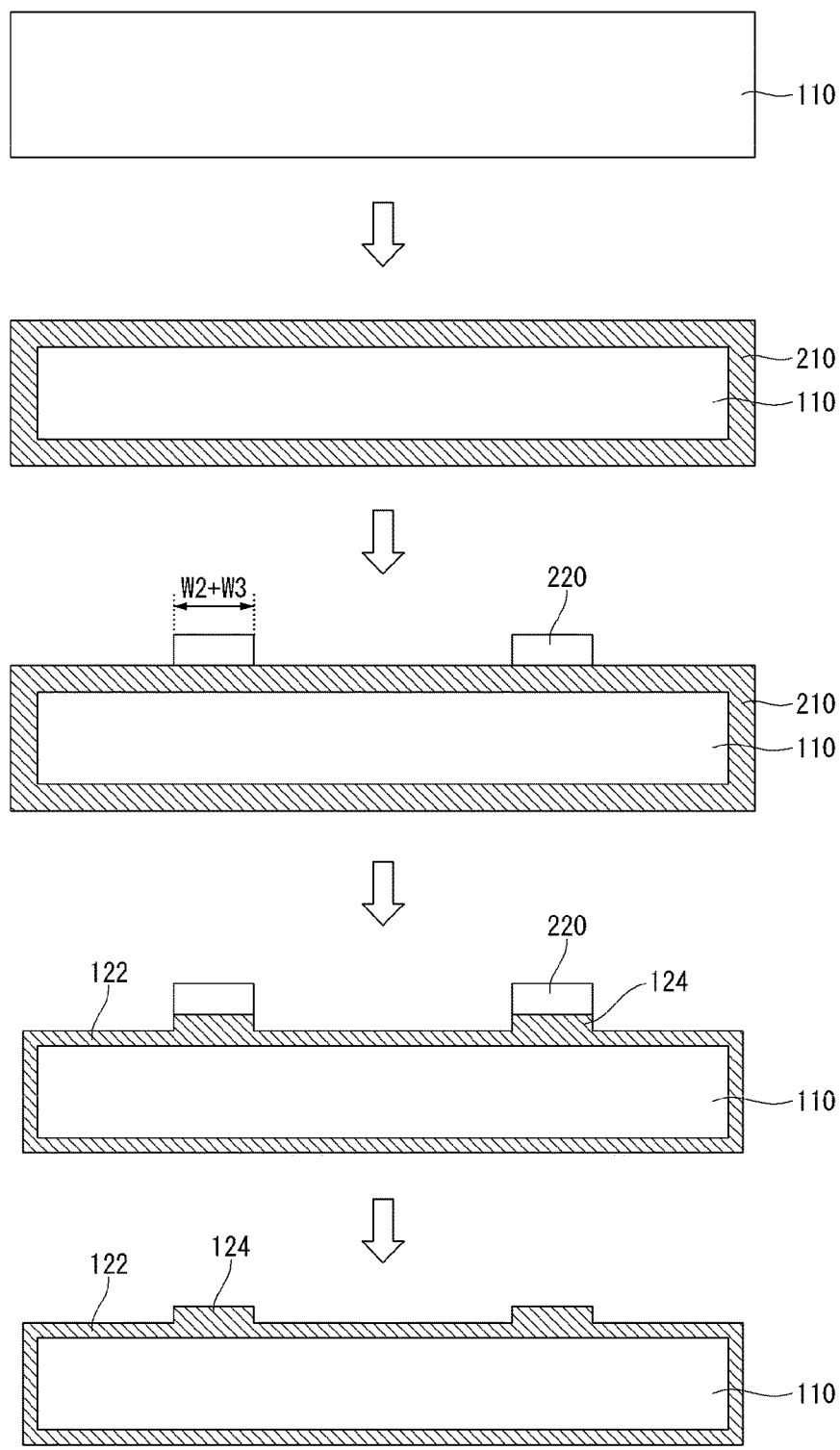
FIG. 8 illustrates a method for forming a selective emitter layer of the selective emitter solar cell according to the first example embodiment of the invention.

More specifically, as shown in FIG. 8, a diffusion process is performed to form a heavily doped region 210 on the entire surface of the substrate 110. An etch stop mask 220 is then formed at a location to form the second emitter portion 124. In this instance, the etch stop mask 220 formed at a location to form the first electrode 140 has a line width corresponding to a sum (W2+W3) of the line width W2 of the first region 124a and the line width W3 of the second region 124b. Further, the etch stop mask 220 formed at a location to form the first current collector 150 has a line width corresponding to a sum (W1+W4) of the line width W1 of the third region 124c and the line width W4 of the fourth region 124d. The line width of the etch stop mask 220 may be properly set so that the line width W3 of the second region 124b is about one to eight times, preferably about one to four times the line width W2 of the first region 124a.

Subsequently, an etching process is performed using the etch stop mask 220 to partially remove the heavily doped region 210 formed at a location to form the first emitter portion 122 by a predetermined thickness. Hence, the first emitter portion 122 and the second emitter portion 124 are formed. A cleansing process is then performed to remove the etch stop mask 220.

Figure 9:
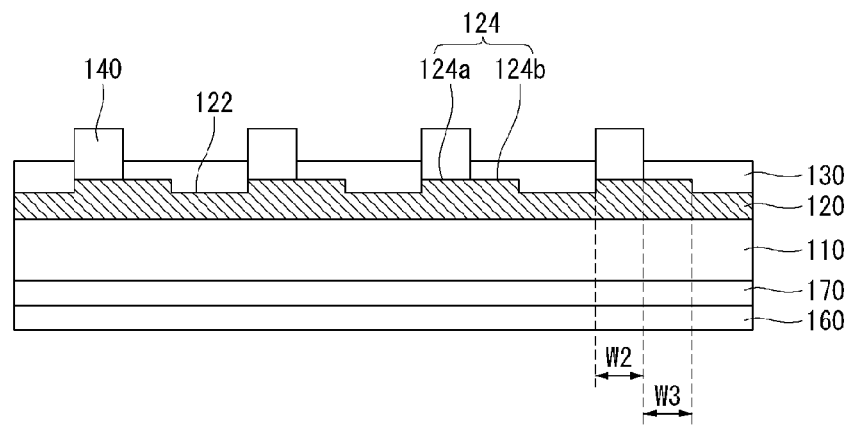
FIG. 9 is a partial cross-sectional view of a selective emitter solar cell according to a modification of the first example embodiment of the invention.

FIG. 9 is a partial cross-sectional view of a selective emitter solar cell according to a modification of the first example embodiment of the invention. The modification illustrated in FIG. 9 is substantially the same as the first example embodiment of the invention, except that one end of the first electrode 140 and one end of the first region 124a are on the same line and thus the second region 124b is positioned at one side of the first region 124a or although it is not shown, one end of the first current collector 150 and one end of the third region 124c are on the same line and thus the fourth region 124d is positioned at one side of the third region 124c. In embodiments of the invention, the one end of the first electrode 140 and the one end of the first region 124a may be not exactly on the same line, but can be offset by a small amount, such as by a distance that is less than a line width of the second region 124b. Similarly, the one end of the first current collector 150 and the one end of the third region 124c may be not exactly on the same line, but can be offset by a small amount, such as by a distance that is less than a line width of the fourth region 124d.

Figure 10:
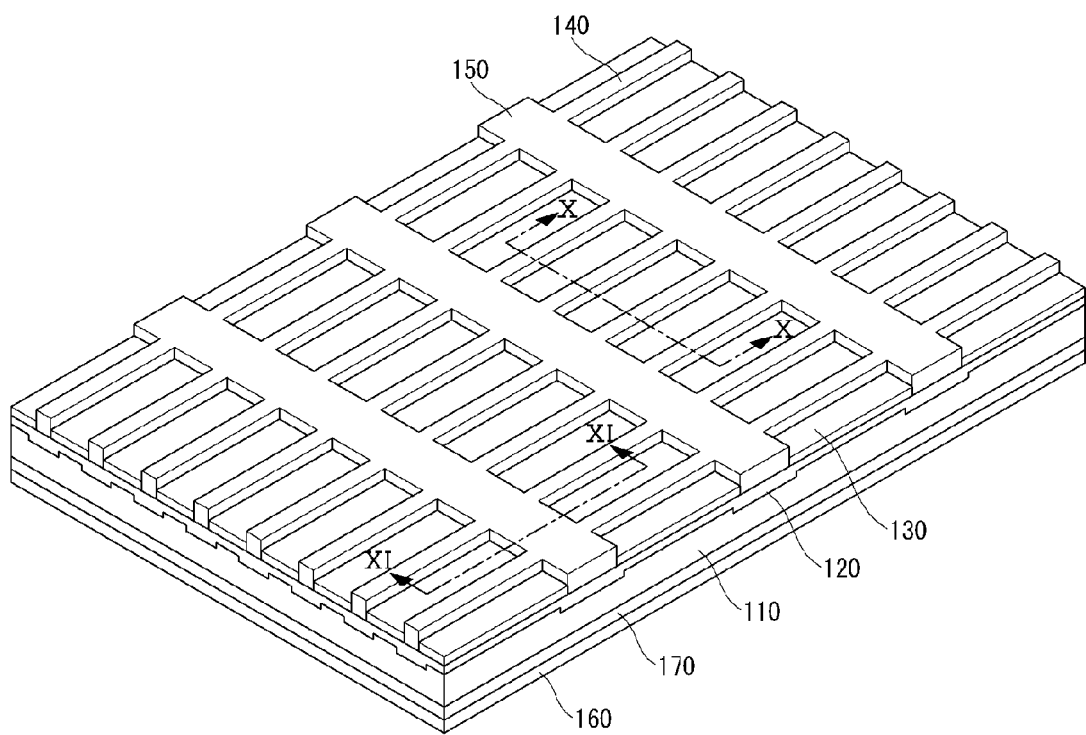
FIG. 10 is a partial perspective view of a selective emitter solar cell according to a second example embodiment of the invention.
Figure 11:
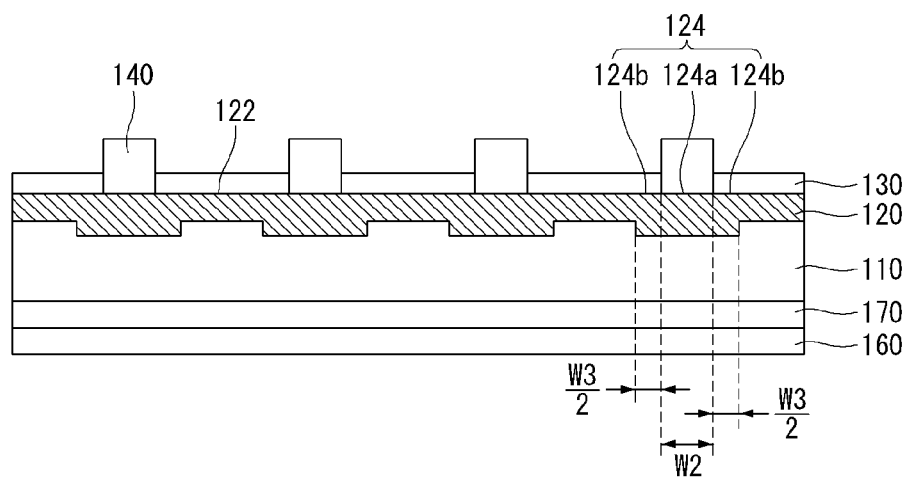
FIG. 11 is a partial cross-sectional view taken along line X-X of FIG. 10.
Figure 12:
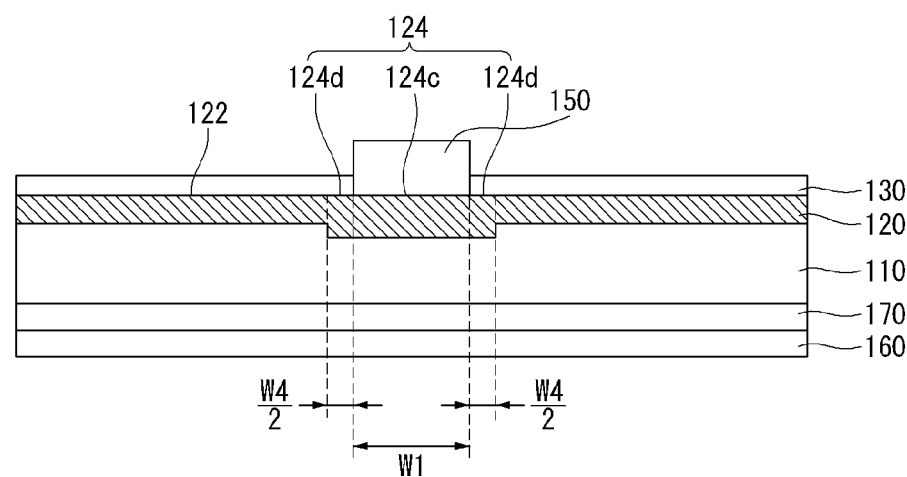
FIG. 12 is a partial cross-sectional view taken along line XI-XI of FIG. 10.

A selective emitter solar cell according to a second example embodiment of the invention is described below with reference to FIGS. 10 to 12. Since configuration of the selective emitter solar cell according to the second example embodiment of the invention is substantially the same as configuration of the selective emitter solar cell according to the first example embodiment of the invention except the selective emitter structure, a further description may be briefly made or may be entirely omitted.

In a selective emitter layer 120 according to the second example embodiment of the invention, an impurity doping thickness of a second emitter portion 124 is greater than an impurity doping thickness of a first emitter portion 122. Thus, an upper surface of the first emitter portion 122 and an upper surface of the second emitter portion 124 are positioned on the same plane.

As above, because the impurity doping thickness of the second emitter portion 124 is greater than the impurity doping thickness of the first emitter portion 122, a surface resistance of the second emitter portion 124 is less than a surface resistance of the first emitter portion 122.

The selective emitter layer 120 having the above-described structure may be formed using a laser doping process, laser patterning and laser doping processes, or a process using a diffusion prevention layer.

Figure 13:
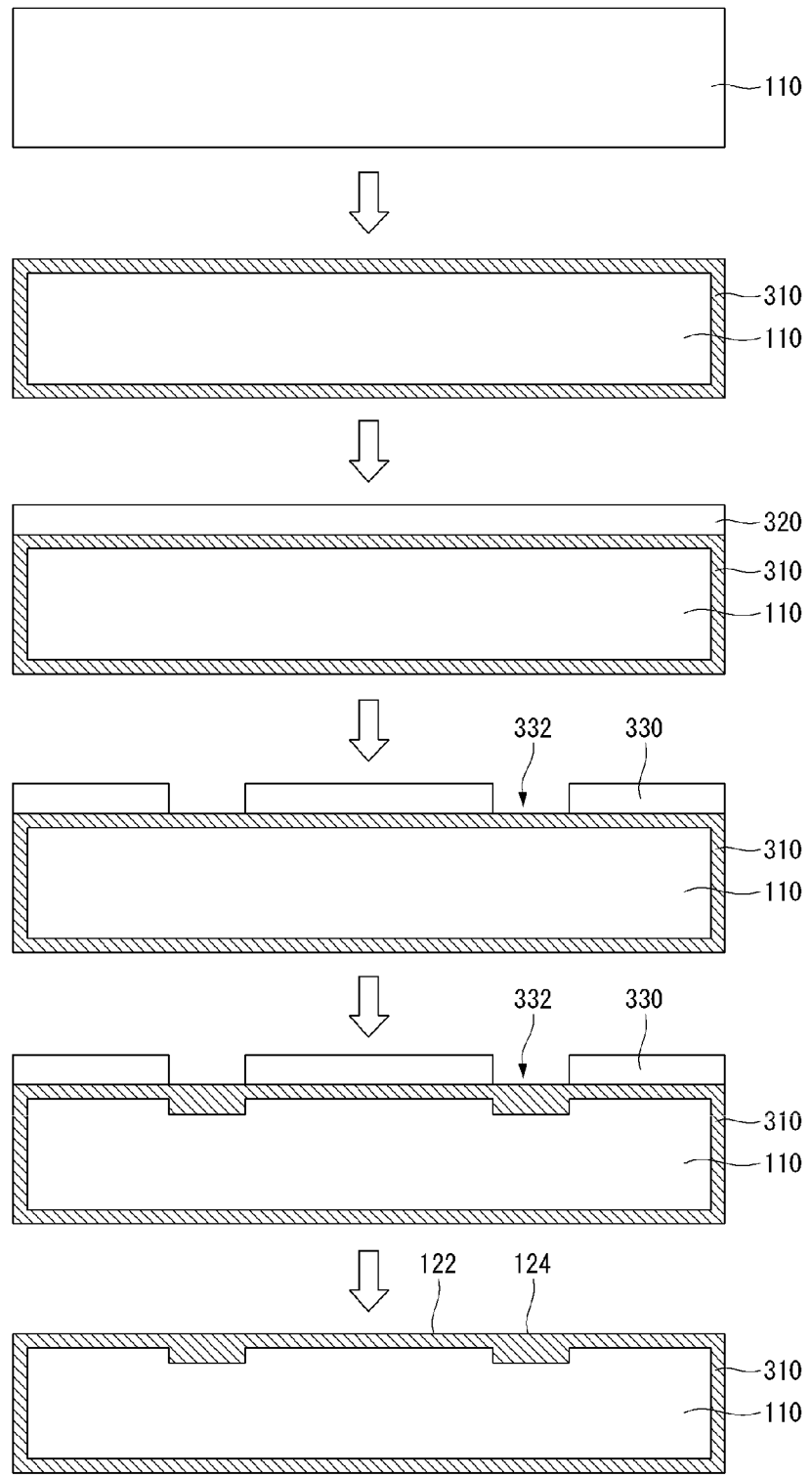
FIG. 13 illustrates a method for forming a selective emitter layer of the selective emitter solar cell according to the second example embodiment of the invention.

Out of the above processes, the process using the diffusion prevention layer is described below with reference to FIG. 13.

First, a diffusion process is performed to form a lightly doped region 310 on the entire surface of the substrate 110. A diffusion prevention layer 320 is formed on a front surface of the substrate 110 and then is patterned to form a mask pattern 330. In this instance, the mask pattern 330 has a hole pattern 332 at a location to form the second emitter portion 124. A laser or an etching paste may be used to form the hole pattern 332.

The hole pattern 332 formed at the location to form the first electrode 140 has a line width corresponding to a sum (W2+W3) of the line width W2 of the first region 124a and the line width W3 of the second region 124b. Further, the hole pattern 332 formed at a location to form the first current collector 150 has a line width corresponding to a sum (W1+W4) of the line width W1 of the third region 124c and the line width W4 of the fourth region 124d. The line width of the hole pattern 332 may be properly set so that the line width W3 of the second region 124b is about one to four times the line width W2 of the first region 124a.

Subsequently, a diffusion process is again performed and impurities are injected into the lightly doped region 310 through the hole pattern 332 to form the second emitter portion 124 thicker than the first emitter portion 122. A cleansing process is then performed to remove the mask pattern 330.

A method for forming the selective emitter layer 120 using the diffusion prevention layer may include a method in which the heavily doped region is formed after forming the mask pattern and the lightly doped region is formed after removing the mask pattern, or a method in which the mask pattern is used as a transflective layer by adjusting a thickness of the mask pattern and the diffusion process is once performed to form the first and second regions in a formation area of the hole pattern, in addition to the above processes.

Additionally, when the selective emitter layer is formed using the laser doping process, the lightly doped region may be formed on the entire surface of the substrate and then a laser may be irradiated to a portion of the lightly doped region to form a laser irradiation portion as the second emitter portion.

Further, when the selective emitter layer is formed using the laser patterning and laser doping processes, the lightly doped region may be formed on the entire surface of the substrate, the anti-reflection layer may be formed on the front surface of the substrate, and a patterning of the anti-reflection layer and a formation of the second emitter portion may be simultaneously performed by adjusting laser conditions.

Figure 14:
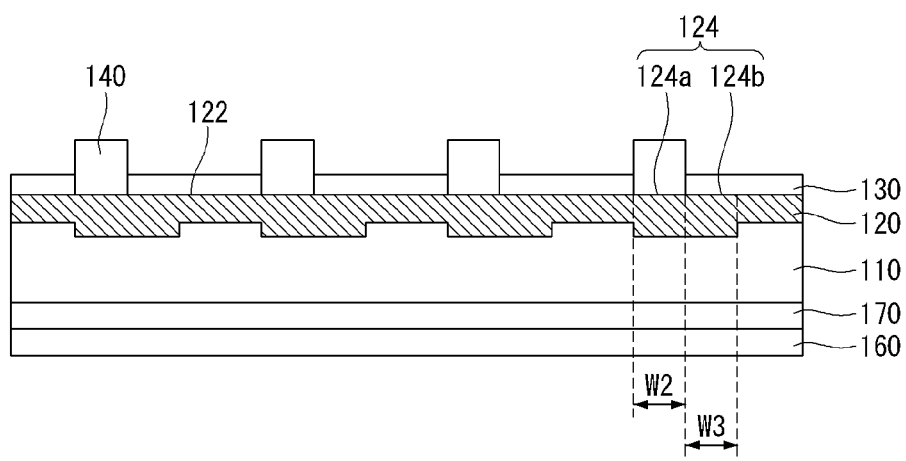
FIG. 14 is a partial cross-sectional view of a solar cell according to a modification of the second example embodiment of the invention.

FIG. 14 is a partial cross-sectional view of a selective emitter solar cell according to a modification of the second example embodiment of the invention. The modification illustrated in FIG. 14 is substantially the same as the second example embodiment of the invention, except that one end of the first electrode 140 and one end of the first region 124a are on the same line and thus the second region 124b is positioned at one side of the first region 124a, or one end of the first current collector 150 and one end of the third region 124c are on the same line and thus the fourth region 124d is positioned at one side of the third region 124c.

In another of the invention, a thickness of the second emitter portion 124 is greater than a thickness of the first emitter portion 122, a lower surface of the first emitter portion 122 and a lower surface of the second emitter portion 124 are positioned on different planes, and an upper surface of the first emitter portion 122 and an upper surface of the second emitter portion 124 are positioned on different planes. In such an instance, additionally, all upper surfaces of the first emitter portion 122 may be on the same plane, all lower surfaces of the first emitter portion 122 may be on the same plane, all upper surfaces of the second emitter portion 124 may be on the same plane, and all lower surfaces of the second emitter layer 124 may be on the same plane.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A manufacturing method of a selective emitter solar cell, the method comprising:
    forming an emitter layer positioned on a light receiving surface of a substrate having a first conductive type, the emitter layer having a second conductive type opposite to the first conductive type at a first impurity concentration;
    forming a high concentration emitter portion having a second impurity concentration higher than the first impurity concentration on the emitter layer; and
    forming a plurality of first electrodes and a current collector connected to the high concentration emitter portion after forming a selective emitter structure having the emitter layer and the high concentration emitter portion, each of the plurality of first electrodes having a first line width (W2) and the current collector having a second line width (W1) greater than the first line width,
    wherein the high concentration emitter portion includes;
    a first contact portion having the first line width (W2), and which is in contact with the plurality of first electrodes;
    a first non-contact portion having a third line width (W3), and which is positioned around the first contact portion and is not in contact with the plurality of first electrodes;
    a second contact portion having the second line width (W1), and which is in contact with the current collector; and
    a second non-contact portion having a fourth line width (W4), and which is positioned around the second contact portion and is not in contact with the current collector,
    wherein the third line width (W3) is equal to or greater than the first line width (W2) and less than or equal to eight times the first line width (W2), and
    wherein the fourth line width (W4) is greater than the second line width (W1) and less than or equal to 1.4 times the second line width (W1).

2. The manufacturing method of a selective emitter solar cell of claim 1, wherein the first line width (W2) of each first electrode is 40 μm to 100 μm.

3. The manufacturing method of a selective emitter solar cell of claim 1, wherein the forming of the emitter layer and the high concentration emitter portion includes:
    forming an etch stop mask on a portion of the emitter layer to form the high concentration emitter portion;
    etching the emitter layer in a state that the etch stop mask is partially positioned on the emitter layer; and
    removing the etch stop mask.

4. The manufacturing method of a selective emitter solar cell of claim 3, wherein in the etching of the emitter layer, another portion of the emitter layer on which the etch stop mask is not positioned, is etched to a predetermined thickness.

5. The manufacturing method of a selective emitter solar cell of claim 4, wherein by the etching of the emitter layer, the portion of the emitter layer on which the etch stop mask is positioned, is formed of the high concentration emitter portion.

6. The manufacturing method of a selective emitter solar cell of claim 3, wherein a position of the etch stop mask on the emitter layer is overlapped with a position to form the plurality of first electrodes.

7. The manufacturing method of a selective emitter solar cell of claim 6, wherein a line width of the etch stop mask on the position to form the plurality of first electrodes equals a sum of the first line width of the first contact portion and the third line width of the first non-contact portion.

8. The manufacturing method of a selective emitter solar cell of claim 3, wherein a position of the etch stop mask on the emitter layer is overlapped with a position to form the current collector.

9. The manufacturing method of a selective emitter solar cell of claim 8, wherein a line width of the etch stop mask on the position to form the current collector equals a sum of the second line width of the second contact portion and the fourth line width of the second non-contact region.

10. The manufacturing method of a selective emitter solar cell of claim 1, wherein the forming of the high concentration emitter portion includes:
    forming the mask pattern on the emitter layer, the mask pattern having a hole pattern;
    doping additionally an impurity of the second conductive type on the emitter layer through the hole pattern to form the high concentration emitter portion; and
    removing the mask pattern.

11. The manufacturing method of a selective emitter solar cell of claim 1, wherein the forming of the high concentration emitter portion is formed by the doping, and a doping depth of the high concentration emitter portion is more than a doping depth of the emitter layer.

12. The manufacturing method of a selective emitter solar cell of claim 1, further comprising a hole pattern on the emitter layer, wherein a position of the hole pattern on the emitter layer is overlapped with a position to form the plurality of first electrodes.

13. The manufacturing method of a selective emitter solar cell of claim 12, wherein a line width of the hole pattern on the position to form the plurality of first electrodes equals a sum of the first line width of the first contact portion and the third line width of the first non-contact portion.

14. The manufacturing method of a selective emitter solar cell of claim 1, further comprising a hole pattern on the emitter layer, wherein a position of the hole pattern on the emitter layer is overlapped with a position to form the current collector.

15. The manufacturing method of a selective emitter solar cell of claim 14, wherein a line width of the hole pattern on the position to form the current collector equals a sum of the second line width of the second contact portion and the fourth line width of the second non-contact portion.

16. The manufacturing method of a selective emitter solar cell of claim 1, wherein the first non-contact portion has the same width on both sides of the first contact portion being in contact with the plurality of first electrodes.

17. The manufacturing method of selective emitter solar cell of claim 1, wherein the first non-contact portion has a different width on both sides of the first contact portion being in contact with the plurality of first electrodes.

18. The manufacturing method of a selective emitter solar cell of claim 1, wherein the first non-contact portion is formed only on one side of the first contact portion being in contact with the plurality of first electrodes.

19. The manufacturing method of a selective emitter solar cell of claim 1, wherein the second non-contact portion has the same width on both sides of the second contact portion being in contact with the current collector.

20. The manufacturing method of a selective emitter solar cell of claim 1, wherein the second non-contact portion has a different width on both sides of the second contact portion being in contact with the current collector.

21. The manufacturing method of a selective emitter solar cell of claim 1, wherein the second non-contact portion is formed only on one side of the second contact portion being in contact with the current collector.

22. The manufacturing method of a selective emitter solar cell of claim 1, wherein the third line width (W3) of the first non-contact portion and the fourth line width (W4) of the second non-contact portion are the same.

* * * * *